(12) United States Patent
Asadi et al.

(10) Patent No.: US 9,934,867 B2
(45) Date of Patent: Apr. 3, 2018

(54) CAPACITANCE COUPLING PARAMETER ESTIMATION IN FLASH MEMORIES

(71) Applicant: Seagate Technology LLC, Cupertino, CA (US)

(72) Inventors: Meysam Asadi, Honolulu, HI (US); Zhengang Chen, San Jose, CA (US); Erich F. Haratsch, Bethelhem, PA (US)

(73) Assignee: SEAGATE TECHNOLOGY LLC, Cupertino, CA (US)

( * ) Notice: Subject to any disclaimer, the term of this patent is extended or adjusted under 35 U.S.C. 154(b) by 1097 days.

(21) Appl. No.: 14/155,687

(22) Filed: Jan. 15, 2014

(65) Prior Publication Data
US 2015/0194219 A1   Jul. 9, 2015

Related U.S. Application Data

(60) Provisional application No. 61/923,915, filed on Jan. 6, 2014.

(51) Int. Cl.
*G11C 16/34* (2006.01)
*G01R 27/26* (2006.01)
*G11C 11/56* (2006.01)

(52) U.S. Cl.
CPC ...... *G11C 16/3427* (2013.01); *G01R 27/2605* (2013.01); *G11C 16/3422* (2013.01); *G11C 11/5628* (2013.01); *G11C 11/5642* (2013.01)

(58) Field of Classification Search
CPC .................................................. G11C 16/3431
See application file for complete search history.

(56) References Cited

U.S. PATENT DOCUMENTS

| | | | | |
|---|---|---|---|---|
| 4,787,057 | A | * 11/1988 | Hammond | G06F 17/16 708/607 |
| 5,517,115 | A | * 5/1996 | Prammer | G01R 33/4625 324/303 |
| 6,407,948 | B1 | * 6/2002 | Chou | G11C 16/3404 365/185.09 |
| 7,746,702 | B2 | 6/2010 | Cho et al. | 365/185.24 |
| 7,751,237 | B2 | 7/2010 | Alrod et al. | 365/185.02 |
| 8,331,169 | B1 | 12/2012 | Yang et al. | 365/189.15 |

(Continued)

OTHER PUBLICATIONS

Liu et al., Jpn. J. Appl. Phy. vol. 40 (2001) pp. 2958-2962.*

(Continued)

*Primary Examiner* — John Breene
*Assistant Examiner* — Jeffrey C Morgan
(74) *Attorney, Agent, or Firm* — Christopher P. Maiorana, PC

(57) ABSTRACT

A method for capacitance coupling parameter estimation is disclosed. Step (A) of the method determines a plurality of voltages in a plurality of memory cells of a nonvolatile memory in response to a plurality of writes to the memory cells. The voltages are determined in each of a plurality of cases related to inter-cell interference. Step (B) generates a system of equations of a capacitance coupling model in response to the voltages from all of the cases. Step (C) generates one or more parameters in response to the system of equations. The parameters include one or more couplings between a perturbed memory cell and a plurality of neighboring memory cells adjacent to the perturbed memory cell.

20 Claims, 10 Drawing Sheets

(56) References Cited

U.S. PATENT DOCUMENTS

| 8,339,874 | B2 | 12/2012 | Yang et al. | 365/189.15 |
| 2008/0165595 | A1 | 7/2008 | Lam | 365/189.15 |
| 2015/0155835 | A1* | 6/2015 | Al-Qaq | H03F 1/3241 |
| | | | | 375/296 |

OTHER PUBLICATIONS

M. Asadi, X. Huang, A. Kavcic, N.P. Santhanam, "Optimal Detector for Multilevel NAND Flash Memory Channels with Intercell Interference", IEEE Journal on Selected Areas in Communications, Submitted May 10, 2013.

\* cited by examiner

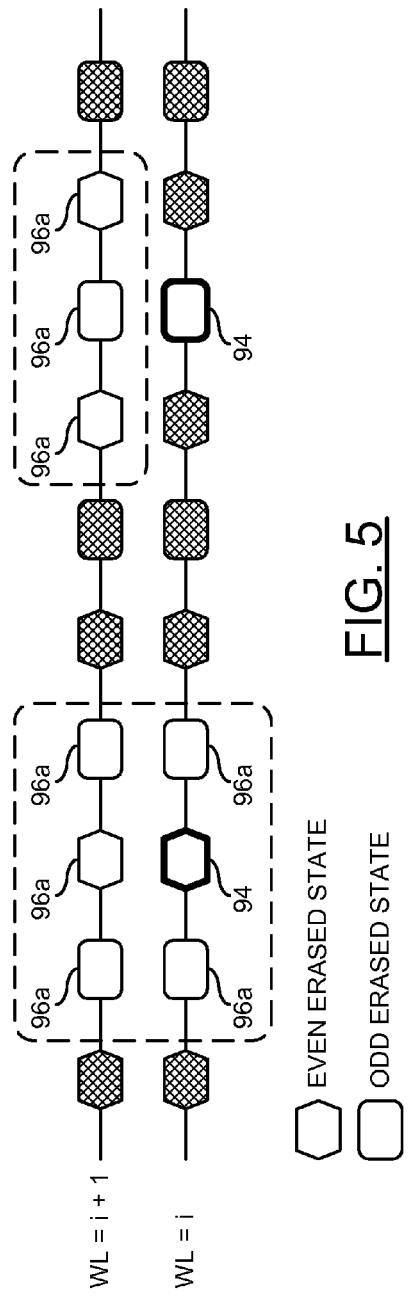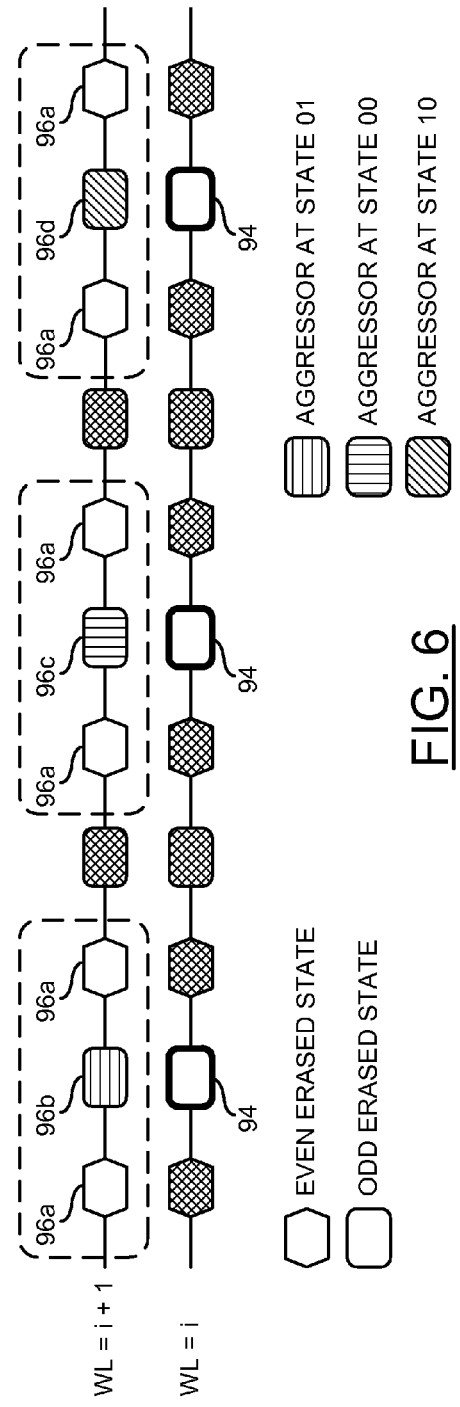

CAPACITANCE COUPLING PARAMETER ESTIMATION IN FLASH MEMORIES

This application relates to U.S. Provisional Application No. 61/923,915, filed Jan. 6, 2014, which is hereby incorporated by reference in its entirety.

FIELD OF THE INVENTION

The invention relates to reading from nonvolatile memory generally and, more particularly, to a method and/or apparatus for implementing capacitance coupling parameter estimation in flash memories.

BACKGROUND

Capacitance coupling noise (i.e., inter-cell interference) causes disturbances in flash memory program operations. As flash memories scale down in geometry, the capacitance coupling noise becomes more severe. Detectors used to read the flash memories are conventionally designed to mitigate the capacitance coupling noise. Existing detector designs are based on a synthetic capacitance coupling noise model. However, variances in the actual capacitance coupling noise among various flash memories from different manufacturers create issues for the synthetic-based detector designs.

SUMMARY

The invention concerns a method for capacitance coupling parameter estimation. Step (A) of the method determines a plurality of voltages in a plurality of memory cells of a nonvolatile memory in response to a plurality of writes to the memory cells. The voltages are determined in each of a plurality of cases related to inter-cell interference. Step (B) generates a system of equations of a capacitance coupling model in response to the voltages from all of the cases. Step (C) generates one or more parameters in response to the system of equations. The parameters include one or more couplings between a perturbed memory cell and a plurality of neighboring memory cells adjacent to the perturbed memory cell.

BRIEF DESCRIPTION OF THE FIGURES

Embodiments of the invention will be apparent from the following detailed description and the appended claims and drawings in which:

FIG. 5 is a diagram of a step in a capacitance coupling estimation method without capacitance coupling interference for both even and odd cells;

FIG. 6 is a diagram demonstrating another step of the capacitance coupling estimation method with vertical capacitance coupling for odd cells;

DETAILED DESCRIPTION OF THE EMBODIMENTS

Embodiments of the invention include providing capacitance coupling parameter estimation in flash memories that may (i) accurately model capacitance coupling noise, (ii) improve detector designs, (iii) operate independently of knowledge of erased state distributions, (iv) operate independently of knowledge of intermediate state distributions and/or (v) be implemented as one or more integrated circuits.

Given unknown parameters of an expected vertical capacitance coupling (e.g., $E[C_v]$), an expected horizontal capacitance coupling (e.g., $E[C_h]$), a mean voltage of an erased state (e.g., $\mu(11)$) and a mean voltage of an intermediate programming state (e.g., $\mu(X0)$), a system of linear equations is created for a capacitance coupling model (combined with other noises). The system of linear equations generally forms an over-determined problem. Thus, an estimation method (e.g., a least mean squares technique) is used to solve the system of linear equations. A similar method can be applied for estimating variances. Simulation results for a hard-decision detector show an improvement in bit error rates. Similar methods can be extended to estimate signal-dependent capacitance coupling parameters, and a further improvement in the bit error rates is observed in the simulations.

Figure 1:
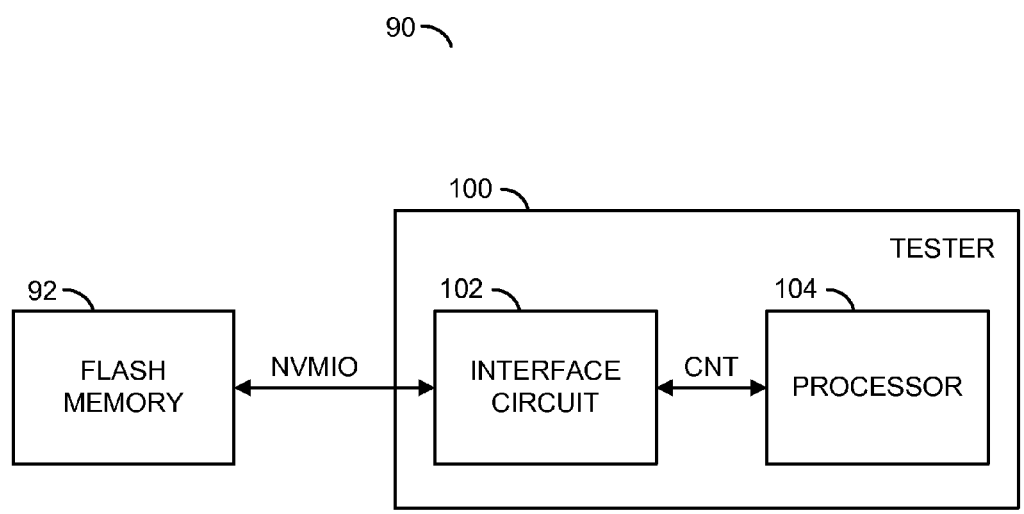
FIG. 1 is a block diagram of an apparatus.

Referring to FIG. 1, a block diagram of an example implementation of an apparatus 90 is shown. The apparatus (or circuit or device or integrated circuit) 90 implements a test computer connected to a nonvolatile memory. The apparatus 90 generally comprises a block (or circuit) 92 and a block (or circuit) 100. The circuit 100 generally comprises a block (or circuit) 102 and a block (or circuit) 104. The circuits 92 to 104 may represent modules and/or blocks that may be implemented as hardware, software, a combination of hardware and software, or other implementations.

One or more signals (e.g., NVMIO) are exchanged between the circuit 100 and the circuit 92. The nonvolatile memory input/output signal NVMIO generally includes, but is not limited to, a physical address component used to access data in the circuit 92, a memory command component that controls the circuit 92 (e.g., read or write commands), a write codeword component that carries error correction coded and cyclical redundancy check protected write codewords written from the circuit 100 into the circuit 92 and a read codeword component that carries the error correction coded codewords read from the circuit 92 to the circuit 100. One or more signals (e.g., CNT) are shown exchanged between the circuit 102 and the circuit 104. The signal CNT generally controls circuit 102 to perform the read and write operations to and from the circuit 92. The signal CNT includes a reference voltage control component that adjusts the voltage used by the circuit 92 during reads. The signal CNT also includes a measured voltage component that identifies the actual voltage stored in the memory cells of the circuit 92.

The circuit 92 is shown implementing one or more nonvolatile memory circuits (or devices). According to various embodiments, the circuit 92 comprises one or more nonvolatile semiconductor devices. The circuit 92 is generally operational to store data in a nonvolatile condition. When data is read from the circuit 92, the circuit 92 accesses a set of data (e.g., multiple bits) identified by the address (e.g., a physical address) in the signal NVMIO. The address generally spans a physical address range of the circuit 92.

In some embodiments, the circuit 92 is implemented as a multi-level cell type circuit. A multi-level cell type circuit is capable of storing multiple (e.g., two) bits per memory cell (e.g., logical 00, 01, 10 or 11). In other embodiments, the circuit 92 is implemented as a single-level cell (e.g., SLC) type circuit. A single-level cell type circuit generally stores a single bit per memory cell (e.g., a logical 0 or 1). In still other embodiments, the circuit 92 may implement a triple-level cell type circuit. A triple-level cell circuit stores multiple (e.g., three) bits per memory cell (e.g., a logical 000, 001, 010, 011, 100, 101, 110 or 111). A four-level cell type circuit may also be implemented. The examples provided are based on two bits per cell type devices and may be applied to all other types of nonvolatile memory.

Data within the circuit 92 is generally organized in a hierarchy of units. A block is a smallest quantum of erasing. A page is a smallest quantum of writing. A codeword (or read unit or Epage or ECC-page) is a smallest quantum of reading and error correction. Each block includes an integer number of pages. Each page includes an integral number of codewords.

The circuit 100 is shown implementing a tester circuit. The circuit 100 is generally operational to control reading from and writing to the circuit 92. In some embodiments, the data is random test data. The circuit 100 includes an ability to measure voltages of each bit in the read codewords received from the circuit 92. The circuit 100 is also configured to analyze the measured voltages to determine one or more capacitance coupling parameters of the circuit 92. The circuit 100 comprises one or more integrated circuits (or chips or die) implementing the tester circuit. In various embodiments, the circuit 100 is implemented in a tester configuration. The tester configuration is used to characterize the circuit 92. In some embodiments, the circuit 100 is implemented in a controller configuration. The controller configuration is used in normal operations to control the circuit in response to commands received from one or more host computers. In some situations, the circuit 100 can operate in both the tester configuration and the controller configuration.

The circuit 102 is shown implementing an interface circuit. The circuit 102 is operational to communicate with the circuit 92 to read and write data. The circuit 102 is generally controlled by the circuit 104 via the signal CNT. The stored voltages read from the memory cells of the circuit 92 are digitized by the circuit 102 and reported back to the circuit 104 via the signal CNT.

The circuit 104 is shown implementing a processor circuit. The circuit 104 is generally operational to determine mean voltages in the memory cells in response to multiple writes to the cells. The mean voltages are determined in each of several cases. The circuit 104 is also operational to create a system of equations containing the mean voltages from all of the cases and generate one or more parameters by solving the system of equations. The parameters generally include one or more couplings between a victim (or perturbed) cell and a plurality of aggressor (or neighboring) cells adjacent to the victim cell in the circuit 92. In some embodiments, the cases include (i) a final voltage case, (ii) a no inter-cell interference case, (iii) a vertical capacitance coupling case and (iv) a horizontal capacitance coupling case. In various embodiments, the parameters include (i) a mean voltage of the victim cells in an erased state, and (ii) a mean voltage of the victim cells after programming a lower page and before programming an upper page in the victim cell. The parameters are useful in designing a detector within a controller circuit to be used with the circuit 92.

Figure 2:
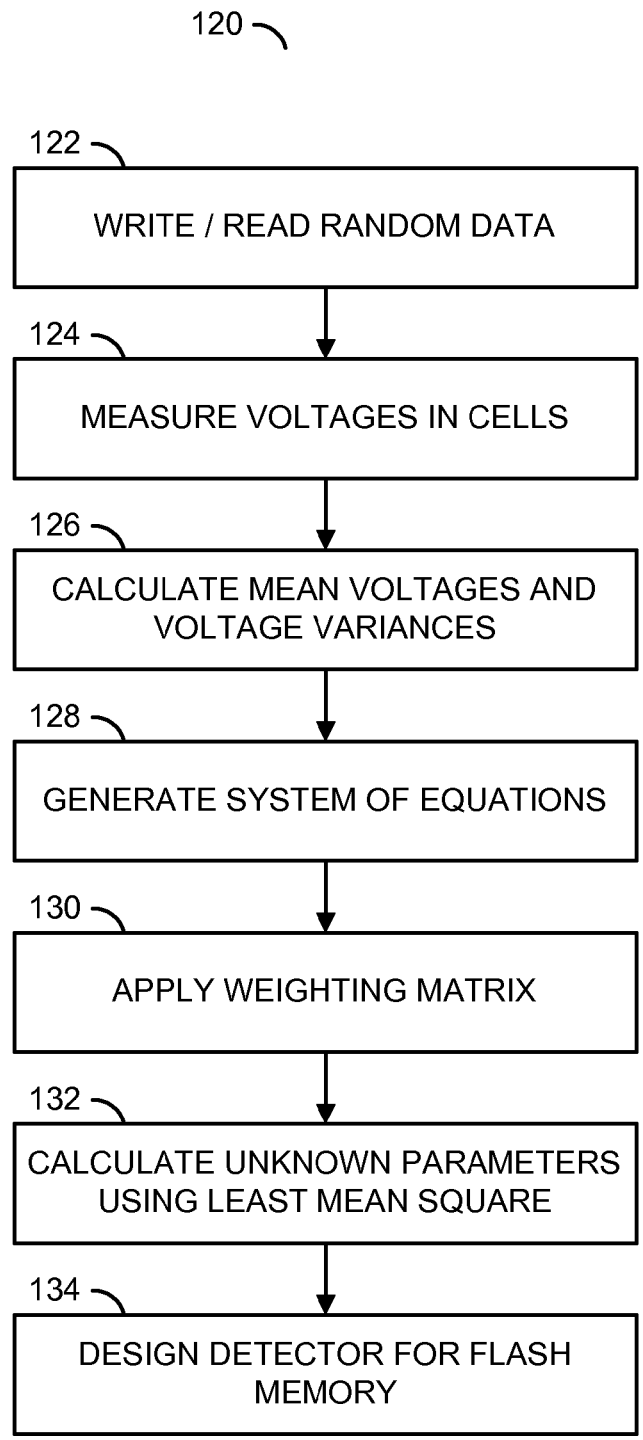
FIG. 2 is a flow diagram of a method for estimating parameters in accordance with an embodiment of the invention.

Referring to FIG. 2, a flow diagram of an example implementation of a method 120 for estimating the parameters is shown in accordance with an embodiment of the invention. The method (or process) 120 is implemented by the circuit 100. The method 120 generally comprises a step (or state) 122, a step (or state) 124, a step (or state) 126, a step (or state) 128, a step (or state) 130, a step (or state) 132, and a step (or state) 134. The steps 122 to 134 may represent modules and/or blocks that may be implemented as hardware, software, a combination of hardware and software, or other implementations. The sequence of the steps 122 to 134 is shown as a representative example. Other step orders may be implemented to meet the criteria of a particular application.

In the step 122, the circuit 100 writes and reads random data to and from the circuit 92. During each read, the circuit 102 measures the voltage sensed on the memory cells being read as part of the step 124. The circuit 104 calculates mean voltages and mean voltage variances for the memory cells in the step 126.

The circuit 104 generates a system of linear equations in the step 128 using the means voltages and/or the mean variances. In the step 130, a weighting matrix is optionally applied to the system of linear equations to negate (or reduce) an influence of memory cells programmed to a highest voltage state (e.g., state 10) and/or any state with incomplete information. Reading the memory cells programmed to the highest voltage state is generally inaccurate due to limitations in generating high threshold voltages internal to the circuit 92. The circuit 104 calculates the unknown parameters in the step 132 by solving the system of linear equations. In some embodiments, the system of linear equations is solved using a least mean squares technique. Other techniques to solve the equations may be implemented to meet the criteria of a particular application. The parameters are subsequently used in the step 134 to aid in the design of a detector circuit of a controller suitable for use with the circuit 92.

The determination of the parameters can be performed under one or more conditions. In an estimation condition, the parameters are estimated by the circuit 100 (e.g., tester and/or controller configuration) with the circuit 92 off-line (e.g., powered down, modeled or no communication with host computers). In a continuous condition, the parameters are calculated (or determined) by the circuit 100 (e.g., controller configuration) with the circuit 92 on-line (e.g., powered and being written to and read from per the host computers). The circuit 100 runs the steps 122-132 of the method 120 from time to time and subsequently uses the resulting parameters to adjust operations of the detector circuit. The method 120 can be run periodically and/or at certain intervals, such as program-erase count intervals, throughout a life of the circuit 92. Other triggering events to run the method 120 may be used to meet the criteria of a particular application.

Figure 3:
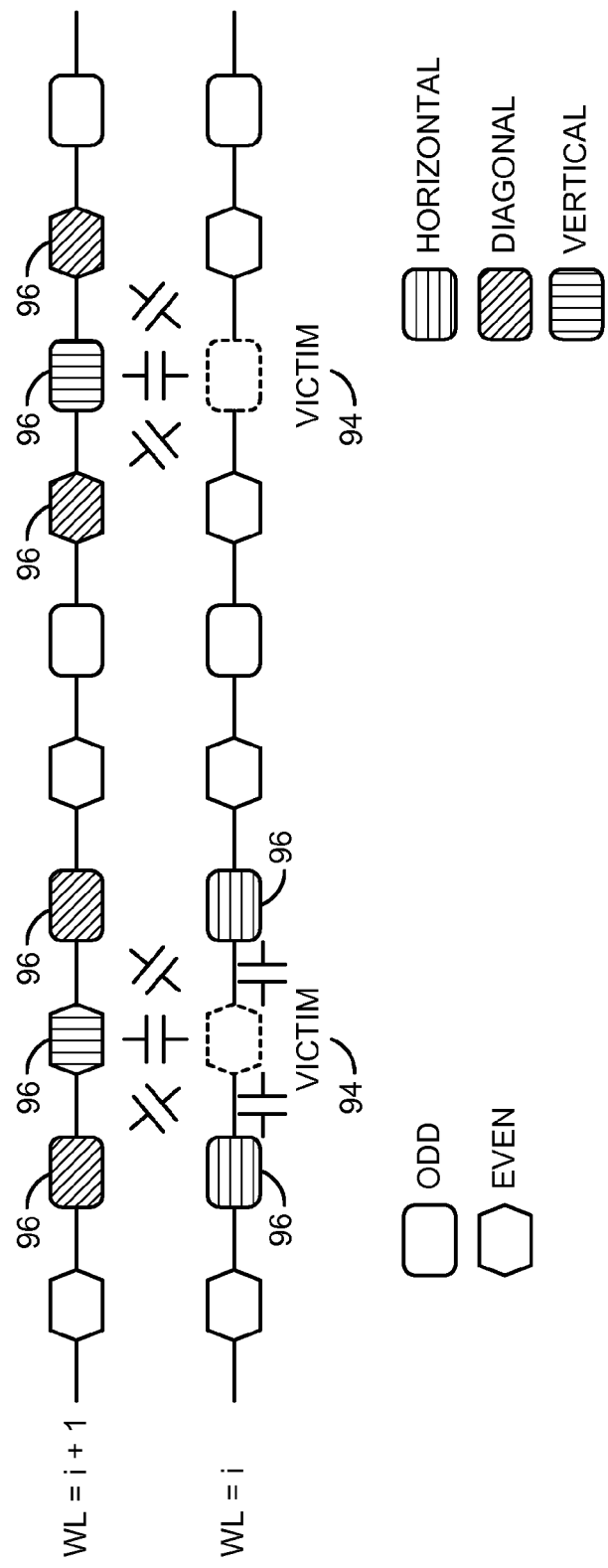
FIG. 3 is a diagram of an example layout of memory cells in a nonvolatile memory with an even and odd structure.

Referring to FIG. 3, a diagram of an example layout of memory cells in the circuit 92 with an even and odd structure is shown. By way of example, each memory cell implements a multi-level type cell (e.g., stores two bits per cell). The memory cells are shown arranged in an even/odd bit line structure. The even memory cells are generally represented as hexagons. The odd memory cells are generally represented as rounded rectangles. Two of many word lines (e.g., WL) are illustrated for a row i and a row i+1.

Programming of a word line is performed in multiple (e.g., two) steps, a step for each page. The even pages are initially programmed and the odd pages are subsequently programmed. Each victim cell 94 is a programmed memory cell interfered with by the subsequent programming of several neighboring (or adjacent) aggressor memory cells 96. In generally, only the aggressor memory cells 96 immediately adjoining a victim memory cell 94 contribute to the capacitance coupling noise.

Some capacitance coupling noise for both even and odd victim cells 94 comes from the programming of vertically neighboring and diagonally neighboring aggressor memory cells 96. Additional capacitance coupling noise for the even victim cells 94 comes from the programming of horizontally neighboring aggressor memory cells 96. Therefore, the even victim memory cells 94 are generally interfered with more than the odd victim memory cells 94.

Figure 4:
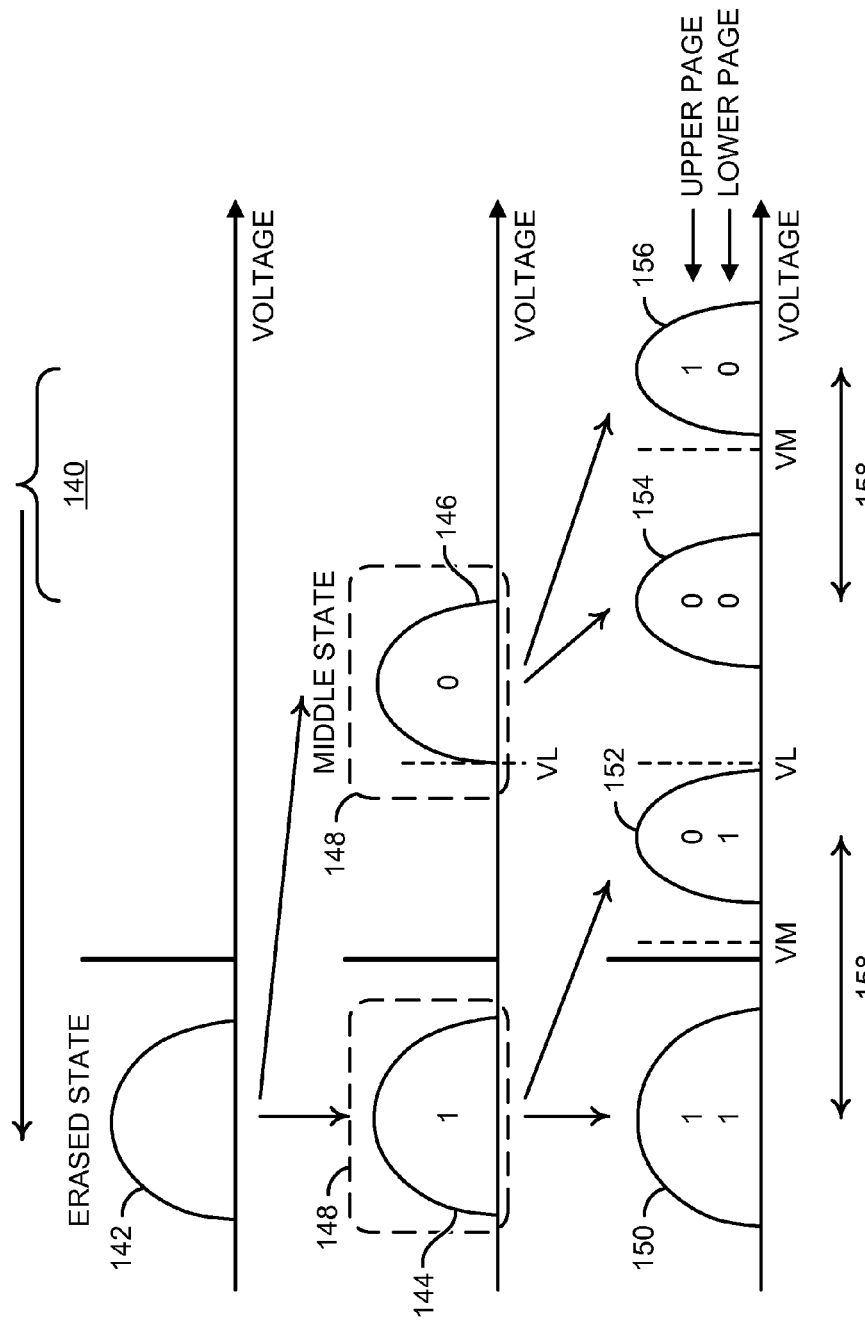
FIG. 4 is a graph of multi-level cell voltage distributions during programming.

Referring to FIG. 4, a graph of example multi-level cell voltage distributions during programming is shown. In the multi-level cell type device, each memory cell generally stores multiple (e.g., 2) bits and utilizes multiple (e.g., 3) threshold voltage (e.g., VL and two VM) levels during a read. In some nonvolatile memories, gray mapping is used to map the bit values to the threshold voltage levels. The multiple bits in each memory cell generally reside in multiple (e.g., 2) pages: the lower page and the upper page.

Memory cells in any original state 140 are erased to an erased state 142 before programming. Where the lower pages (or least significant bits) of the memory cells are programmed to a logical one value, the memory cells have middle "one" state distribution 144. Where the lower pages of the memory cells are programmed to a logical zero value, the memory cells have a middle "zero" state distribution 146. Lower page only (e.g., LPO) programming generally leaves the memory cells in the middle (or hidden) states 148 (e.g., states 144 and/or 146).

Programming of the upper pages of the memory cells can cause further changes in the charge distributions in the memory cells (with an exception for the state (11)). Programming logical ones in the upper pages of memory cells in the middle state 144 result in the state 150. Programming logical zeros in the upper pages of memory cells in the middle state 144 result in the state 152. Programming logical zero in the upper pages of memory cells in the middle state 146 result in the state 154. Programming logical ones in the upper pages of memory cells in the middle state 146 result in the state 156. A mean voltage difference of the charge distribution pair (or states) 150 and 152 and the charge distribution pair (or states) 154 and 156 is typically a predetermined voltage 158.

To read the lower page, a center reference voltage (e.g., voltage VL) is used. Cells below the center reference voltage VL are sensed as logical ones. Cells above the center reference voltage VL are sensed as logical zeros.

To read the upper page, the upper or lower reference voltage (e.g., VM) is applied to the cells, depending on the sensed state of the lower pages. Cells lower than the lower reference voltage VM are sensed as logical ones. Cells between the lower and center reference voltages VM and VL are sensed as logical zeros. Cells between the center and upper reference voltages VL and VM are sensed as logical zeros. Cells above the upper reference voltage VM are sensed as logical ones.

The charge state distributions involve several parameters (e.g., coupling coefficients Cv, Ch and Cd, the erased state (11) and the middle state (X0)) with unknown values. The method 120 estimates the mean and variances of the parameters to aid in the design of detector circuits. In some embodiments, the estimation is based on random data. In other embodiments, the estimation is based on simulations. The data should provide sufficient precision in the read process to accurately measure the observable memory cell voltages. Retention of the random data should not happen. The estimation method works for every programming structure. The estimated parameters are useful where a flash manufacturer does not provide the capacitance coupling noise information for the design of the controller. The estimated parameters are often applied to the design of a detector that mitigates inter-cell interference (e.g., ICI).

A charge (or voltage) in a flash memory cell is modeled by equation 1 as follows:

$$Y^M_{(i,j)} = X_{(i,j)} + N_{(i,j)}(X) + \Sigma_{(a,b) \in A(i,j)} C_{(a,b)}(i,j) \times (Y^M_{(a,b)} - Y^L_{(a,b)})$$ (Eq. 1)

The variable $X_{(i,j)}$ is the state of the memory cell (i,j), where X takes a value from a set of states S={11,10,00,01}. The variable $N_{(i,j)}(X)$ is the noise corresponding to the state X. The variable $A_{(i,j)}$ is the set of aggressor memory cells around the victim memory cell (i,j). The variable $Y^M_{(i,j)}$ is the final voltage stored in the memory cell (i,j). The variable $Y^L_{(i,j)}$ is the voltage stored in the memory cell (i,j) after programming the lower page (or least significant bit) and before programming the upper page (or most significant bit). The two variables $X_{(i,j)}$ and $N_{(i,j)}(X)$ model the memory cell state with additive white Gaussian noise. The remaining variables generally model the capacitance coupling. Additional details of the model may be found in the paper "Optimal Detector for Multilevel NAND Flash Memory Channels with Intercell Interference" by M. Asadi et al, submitted to the IEEE Journal on Selected Areas in Communications, which is hereby incorporated by reference in its entirety.

The capacitance coupling is generally estimated for several cases (or modes). The cases are referred to as case 0, case 1, case 2 and case 3. In the case 0, the mean voltage $Y^M_{(i,j)}$ (e.g., $\mu_0$) and the voltage variance (e.g., $\sigma_0^2$) are determined by measurement or simulation for the victim memory cells 94.

Referring to FIG. 5, a diagram of a step in the capacitance coupling estimation method without capacitance coupling interference for both even and odd cells is shown. In the case 1, the mean voltage (e.g., $\mu_1$) and the voltage variance (e.g., $\sigma_1^2$) are calculated for the victim memory cells 94 with no interference (e.g., no inter-cell interference case) from the even aggressor memory cells 96 and the odd aggressor memory cells 96, separately. The mean voltage and voltage variance for case 1 are defined by equations 2 and 3 as follows:

$$E[Y^M_{(i,j)}|case\ 1] = E[X_{(i,j)} + N_{(i,j)}(X)] = \mu_1$$ (Eq. 2)

$$Var[Y^M_{(i,j)}|case\ 1] = Var[X_{(i,j)} + N_{(i,j)}(X)] = \sigma_1^2$$ (Eq. 3)

Referring to FIG. 6, a diagram demonstrating another step f the capacitance coupling estimation method with vertical capacitance coupling for odd cells is shown. Case 2 concerns the vertical coupling to odd victim memory cells 94. The vertical coupling (e.g., Cv) with the aggressor memory cells 96b, 96c and 96d in the states (01), (00) and (10) is defined by equations 4, 5 and 6 as follows:

$$E[Y_{(i,j)}^M] | \text{case } 2, (01)] = \mu_1(Xvic) + E[Cv] \times \quad \text{(Eq. 4)}$$
$$(\mu_0(Xagg = 01) - \mu_X(11)$$
$$= \mu_2(Xvic, Xagg = 01)$$

$$E[Y_{(i,j)}^M] | \text{case } 2, (00)] = \mu_1(Xvic) + E[Cv] \times \quad \text{(Eq. 5)}$$
$$(\mu_0(Xagg = 00) - \mu_X(X0)$$
$$= \mu_2(Xvic, Xagg = 00)$$

$$E[Y_{(i,j)}^M] | \text{case } 2, (10)] = \mu_1(Xvic) + E[Cv] \times \quad \text{(Eq. 6)}$$
$$(\mu_0(Xagg = 10) - \mu_X(X0)$$
$$= \mu_2(Xvic, Xagg = 10)$$

The notation Xvic represents a victim memory cell. The notation Xagg represents an aggressor memory cell. The value $\mu_x(11)$ represents the middle "one" state 144. The value $\mu_x(X0)$ represents the middle "zero" state 146.

Figure 7:
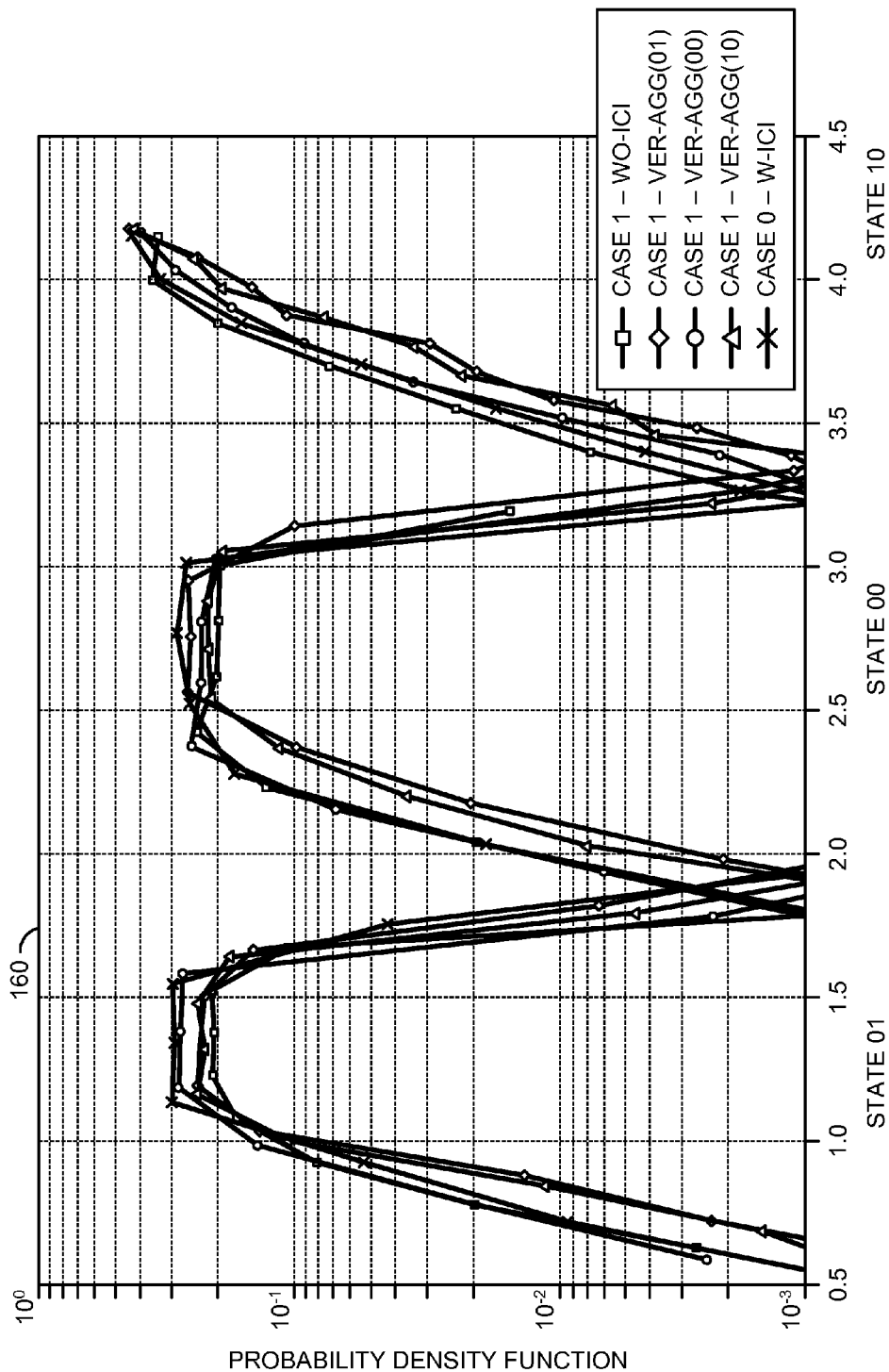
FIG. 7 is a graph of a histogram for odd victim cells changed by vertical capacitance coupling.

Referring to FIG. 7, a graph of a histogram 160 for odd victim cells changed by vertical capacitance coupling is shown. The histogram illustrates results (i) without inter-cell interference (e.g., WO-ICI), (ii) vertical aggressor memory cells in the state (01) (e.g., VER-AGG(01)), (iii) vertical aggressor memory cells in the state (00) (e.g., VER-AGG(00)), vertical aggressor memory cells in the state (10) (e.g., VER-AGG(10)) and (iv) with inter-cell interference (e.g., W-ICI).

Figure 8:
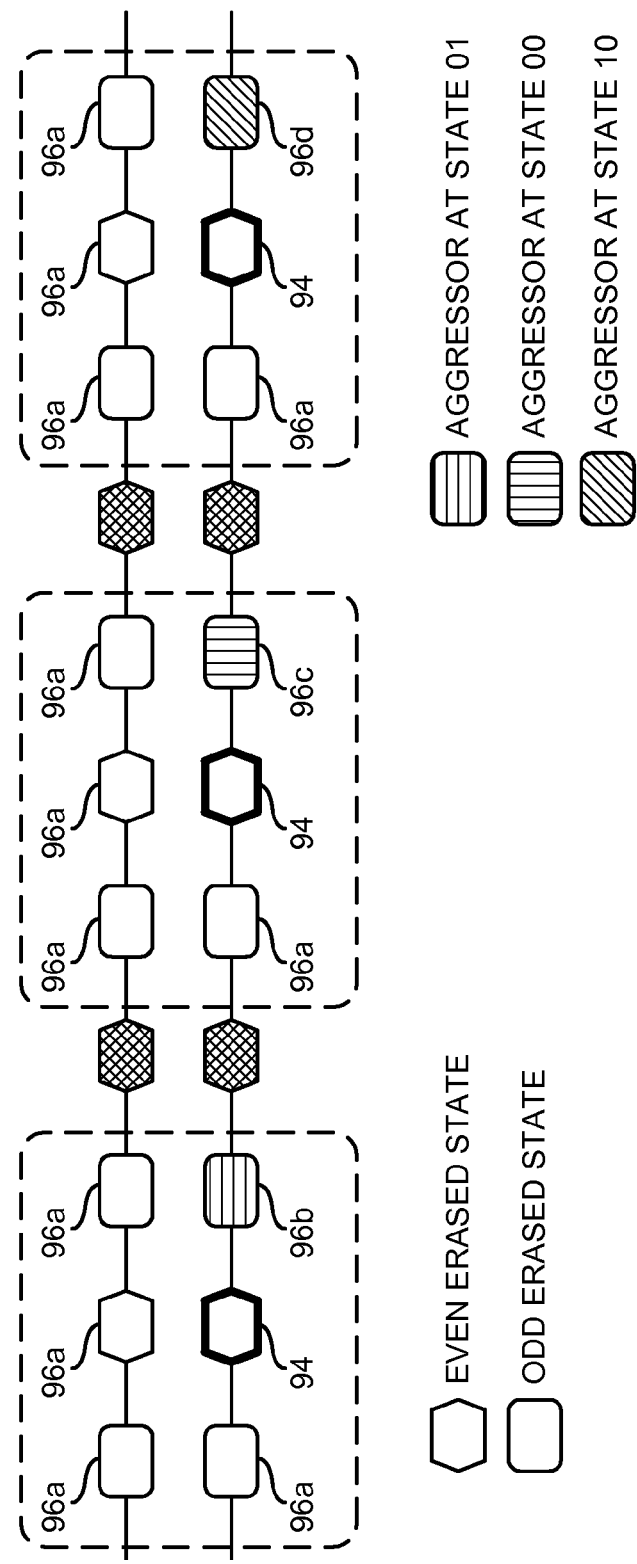
FIG. 8 is a diagram demonstrating a next step of the capacitance coupling estimation method with horizontal coupling for even cells.

Referring to FIG. 8, a diagram demonstrating a next step of the capacitance coupling estimation method with horizontal coupling for even cells is shown. Case 3 concerns the horizontal coupling to even victim memory cells 94. The horizontal coupling (e.g., Ch) with the aggressor memory cells 96b, 96c and 96d in the states (01), (00) and (10) is defined by equations 7, 8 and 9 as follows:

$$E[Y_{(i,j)}^M] | \text{case } 3, (01)] = \mu_1(Xvic) + E[Ch] \times \quad \text{(Eq. 7)}$$
$$(\mu_0(Xagg = 01) - \mu_X(11)$$
$$= \mu_3(Xvic, Xagg = 01)$$

$$E[Y_{(i,j)}^M] | \text{case } 3, (00)] = \mu_1(Xvic) + E[Ch] \times \quad \text{(Eq. 8)}$$
$$(\mu_0(Xagg = 00) - \mu_X(X0)$$
$$= \mu_3(Xvic, Xagg = 00)$$

$$E[Y_{(i,j)}^M] | \text{case } 3, (10)] = \mu_1(Xvic) + E[Ch] \times \quad \text{(Eq. 9)}$$
$$(\mu_0(Xagg = 10) - \mu_X(X0)$$
$$= \mu_3(Xvic, Xagg = 10)$$

Similar equations apply where the aggressor memory cells 96b, 96c and 96d are spatially located left of the victim memory cells 94.

Figure 9:
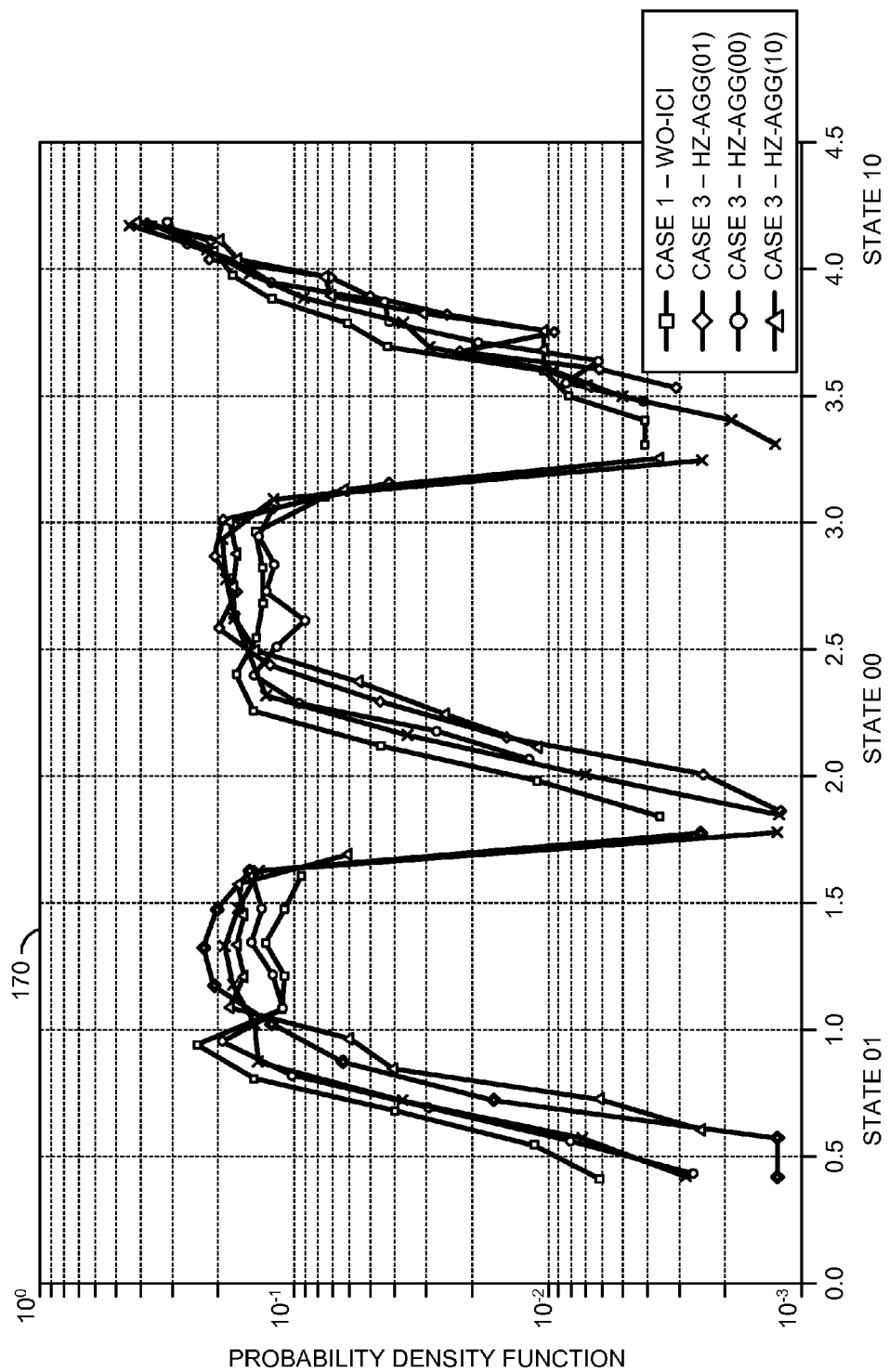
FIG. 9 is a graph of a histogram for even victim cells changed by horizontal capacitance coupling.

Referring to FIG. 9, a graph of a histogram 170 for even victim cells changed by horizontal capacitance coupling is shown. The histogram illustrates results (i) without inter-cell interference (e.g., WO-ICI), (ii) horizontal aggressor memory cells in the state (01) (e.g., HZ-AGG(01)), (iii) horizontal aggressor memory cells in the state (00) (e.g., HZ-AGG(10)) and (iv) horizontal aggressor memory cells in the state (10) (e.g., HZ-AGG(10)).

The diagonal capacitance coupling effects can be considered using a method similar to the vertical coupling and the horizontal coupling. However, physical distances between the diagonal aggressor memory cells 96 and the victim memory cells 94 are larger than in the vertical and horizontal situations. Therefore, the diagonal capacitance coupling is smaller than the vertical capacitance coupling and the horizontal capacitance coupling. In various embodiments, the diagonal capacitance coupling is sufficiently small to be ignored.

A system of linear equations is created from multiple (e.g., nine) equations for the odd victim memory cells 94 and multiple (e.g., nine) equations for the even victim memory cells 94. The equations generally include the unknown parameters E[Cv], E[Ch], $\mu_X(11)$, and $\mu_X(X0)$, without considering the diagonal coupling parameter E[Cd]. The following sets of equations are used to create the system of linear equations:

$$E[Y^M_{(i,j)}|\text{case } 2,u] = \mu_1(Xvic) + E[Cv] \times (\mu_0(Xagg) - \mu_X(11 \text{ or } X0)) \text{ (Totaling 9 equations for odd victims)}$$

$$E[Y^M_{(i,j)}|\text{case } 3,u] = \mu_1(Xvic) + E[Cv] \times (\mu_0(Xagg) - \mu_X(11 \text{ or } X0)) \text{ (Totaling 9 equations for odd victims)}$$

The 18 resulting equations present an over-determined problem with only the four unknowns. A similar procedure can be considered for right and left horizontal effects separately. The result is 27 equations in total with five unknown variables. In some embodiments, the system of linear equations is solved using the least mean squares method (or technique). The 18 equations can be arranged as equation 10 as follows:

$$A \cdot X = B \quad \text{(Eq. 10)}$$

where:

$$[A]_{18 \times 4} = \begin{bmatrix} \mu_2(Xvic = 01, Xagg = 01) - \mu_1(Xvic = 01) & 0 & 1 & 0 \\ \mu_2(Xvic = 01, Xagg = 00) - \mu_1(Xvic = 01) & 0 & 0 & 1 \\ \mu_2(Xvic = 01, Xagg = 10) - \mu_1(Xvic = 01) & 0 & 0 & 1 \\ 0 & \mu_3(Xvic = 01, Xagg = 01) - \mu_1(Xvic = 01) & 1 & 0 \\ 0 & \mu_3(Xvic = 01, Xagg = 00) - \mu_1(Xvic = 01) & 0 & 1 \\ 0 & \mu_3(Xvic = 01, Xagg = 10) - \mu_1(Xvic = 01) & 0 & 1 \\ \vdots & & & \end{bmatrix}$$

$$X = \begin{bmatrix} 1/E[Cv] \\ 1/E[Ch] \\ \mu_X(11) \\ \mu_X(X0) \end{bmatrix}$$

and $$[B]_{18 \times 4} = \begin{bmatrix} \mu_0(X = 01, \text{Odd}) \\ \mu_0(X = 00, \text{Odd}) \\ \mu_0(X = 10, \text{Odd}) \\ \mu_0(X = 01, \text{Even}) \\ \mu_0(X = 00, \text{Even}) \\ \mu_0(X = 10, \text{Even}) \\ \vdots \end{bmatrix}$$

The least mean squares solution is obtained by equation 11 as follows:

$$X = (A^T A)^{-1} A^T B \quad \text{(Eq. 11)}$$

In various embodiments, the solution for X is calculated by the circuit 104. In other embodiments, the data measured by the circuit 100 is exported to an external computer where the solution is calculated.

The data of the state (10) is usually partially available. Limitations in the flash devices prevent the use of high threshold voltages (e.g., >4.5 volts) while reading the memory cells. Therefore, the characteristics for the state (10) are determined only for a lower portion of the state.

The ambiguities introduced by the measurements of the state (10) can be reduced using a weighting matrix (e.g., W). The weighting matrix W is a diagonal matrix that assigns zero weight to data obtained by the state 10. Other weighting matrices can be applied that contain fractions between zero and one. The weights depend of the reliability of observed data for each state.

Incorporating the weighting matrix W into the equation 11 produces equation 12 as follows:

$$X = (A^T W^T W A)^{-1} A^T W^T W B \quad \text{(Eq. 12)}$$

Equation 12 generally provides greater accuracy that equation 11 by eliminating the suspect data.

Figure 10:
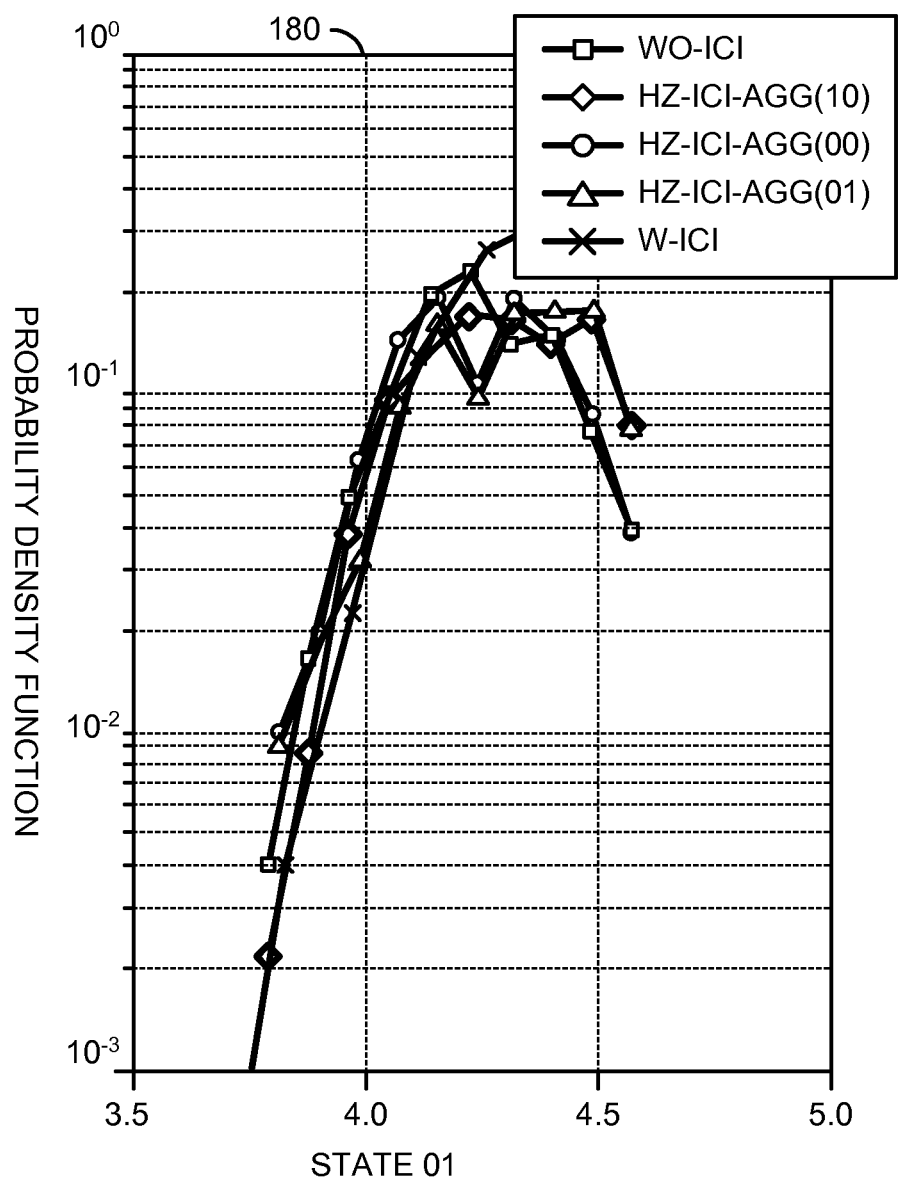
FIG. 10 is a graph of an observable part of a histogram for a state (01)

Referring to FIG. 10, a graph of an observable part of a histogram for a state (01) is shown. The histogram illustrates (i) weighted results without inter-cell interference (e.g., WO-ICI), (ii) horizontal aggressor memory cells in the state (01) (e.g., HZ-ICI-AGG(01)), (iii) horizontal aggressor memory cells in the state (00) (e.g., HZ-ICI-AGG(00)), and (iv) horizontal aggressor memory cells in the state (10) (e.g., HZ-ICI-AGG(10)).

The variances of victim memory cells 94 can be estimated in a similar way to estimating the mean voltages. The main equations change to equation 13 as follows:

$$\mathrm{Var}[Y^M_{(i,j)}|\text{case } 2,u] = \sigma_x^2(S) + [E[Cv]]^2 \times (\mathrm{Var}[Y^M_{(a,b)}](S=10)] + \mathrm{Var}(11 \text{ or } X0)) + (E[Y^M_{(a,b)}](S=10)] - E(11 \text{ or } X0))^2 \times \mathrm{Var}[Cv] + \mathrm{Var}[Cv] \times (\mathrm{Var}[Y^M_{(a,b)}](S=10)] + \mathrm{Var}(11 \text{ or } X0)) \quad \text{(Eq. 13)}$$

The changes in variance due to capacitance coupling is generally small compared with the changes to the mean voltages. To estimate the variance accurately, higher precision is used in the circuit 102 while reading the random data from the circuit 92. In some embodiments where the circuit 92 is simulated, the variance is treated as a constant.

Figure 11:
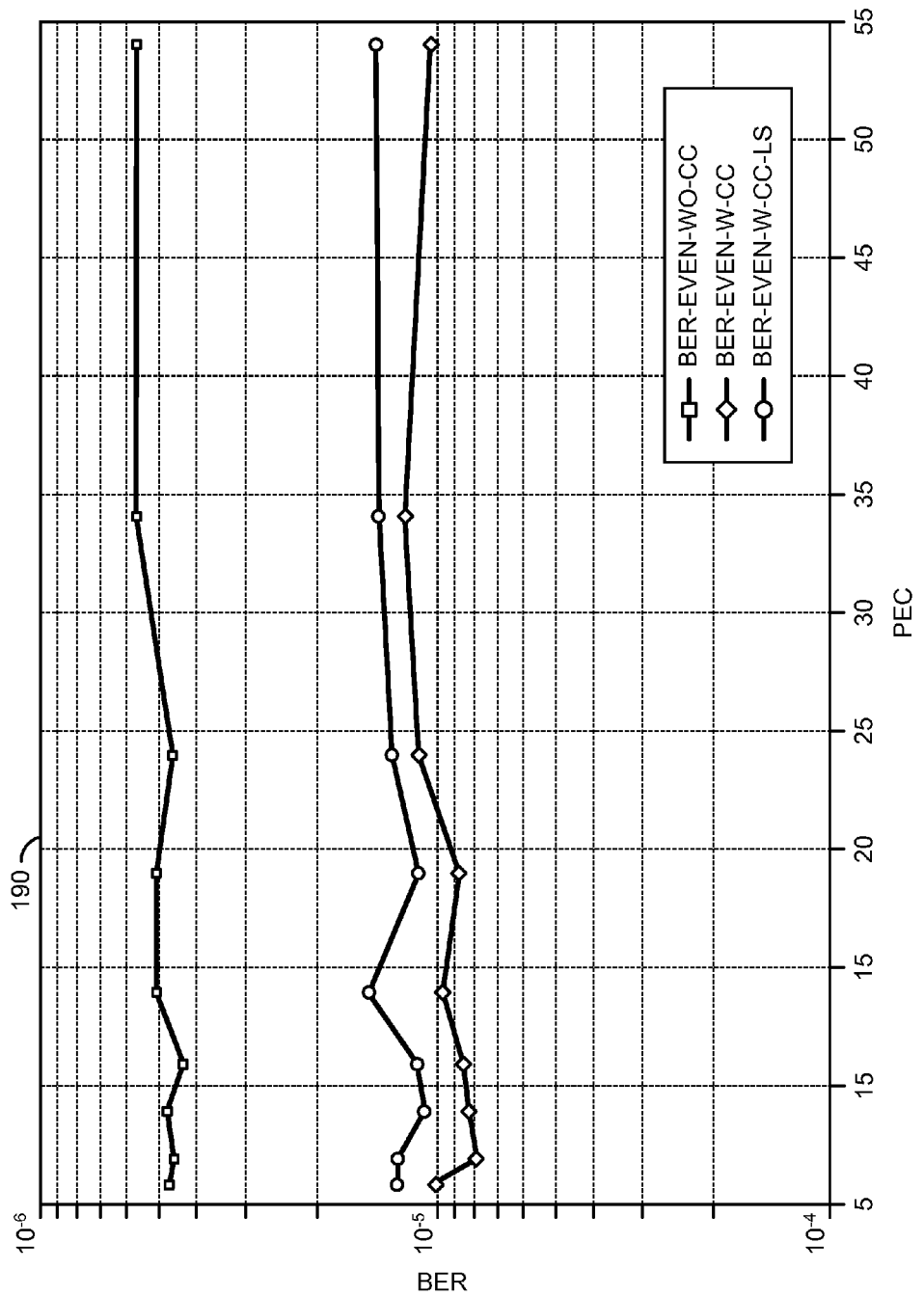
FIG. 11 is a graph of a histogram of a bit error rate improvement.

Referring to FIG. 11, a graph of a histogram 190 of a bit error rate improvement is shown. The figure shows the bit error rate improves by applying the parameter estimation method and using the results in a design of a hard-decision detector. The graph 190 shows the bit error rates for an even memory cell (i) without any capacitance coupling (e.g., WO-CC), (ii) with capacitance coupling (e.g., W-CC), and (iii) with capacitance coupling and a least mean squares solution (e.g., W-CC-LS).

Embodiments of the present invention provide a capacitance coupling parameter estimation method for a multi-level cell (e.g., 2 bits per cell) flash memory. The estimation method operates independently of explicit knowledge of the erased state and/or intermediate (e.g., lower page only) state distributions. The erased state and intermediate state distributions are typically not available when a multi-level cell block is programmed. The solutions for the capacitance coupling are suitable for use in the design of a detector in a flash memory device controller. Such a controller is implemented in computers, flash hard drives and solid-state drives.

The functions performed by the diagrams of FIGS. 1-6, and 8 may be implemented using one or more of a conventional general purpose processor, digital computer, microprocessor, microcontroller, RISC (reduced instruction set computer) processor, CISC (complex instruction set computer) processor, SIMD (single instruction multiple data) processor, signal processor, central processing unit (CPU), arithmetic logic unit (ALU), video digital signal processor (VDSP) and/or similar computational machines, programmed according to the teachings of the specification, as will be apparent to those skilled in the relevant art(s). Appropriate software, firmware, coding, routines, instructions, opcodes, microcode, and/or program modules may readily be prepared by skilled programmers based on the teachings of the disclosure, as will also be apparent to those skilled in the relevant art(s). The software is generally executed from a medium or several media by one or more of the processors of the machine implementation.

The invention may also be implemented by the preparation of ASICs (application specific integrated circuits), Platform ASICs, FPGAs (field programmable gate arrays), PLDs (programmable logic devices), CPLDs (complex programmable logic devices), sea-of-gates, RFICs (radio frequency integrated circuits), ASSPs (application specific standard products), one or more monolithic integrated circuits, one or more chips or die arranged as flip-chip modules and/or multi-chip modules or by interconnecting an appropriate network of conventional component circuits, as is described herein, modifications of which will be readily apparent to those skilled in the art(s).

The invention thus may also include a computer product which may be a storage medium or media and/or a transmission medium or media including instructions which may be used to program a machine to perform one or more processes or methods in accordance with the invention. Execution of instructions contained in the computer product by the machine, along with operations of surrounding circuitry, may transform input data into one or more files on the storage medium and/or one or more output signals representative of a physical object or substance, such as an audio and/or visual depiction. The storage medium may include, but is not limited to, any type of disk including floppy disk, hard drive, magnetic disk, optical disk, CD-ROM, DVD and magneto-optical disks and circuits such as ROMs (read-only memories), RAMS (random access memories), EPROMs (erasable programmable ROMs), EEPROMs (electrically erasable programmable ROMs), UVPROM (ultra-violet erasable programmable ROMs), Flash memory, magnetic cards, optical cards, and/or any type of media suitable for storing electronic instructions.

The elements of the invention may form part or all of one or more devices, units, components, systems, machines and/or apparatuses. The devices may include, but are not limited to, servers, workstations, storage array controllers, storage systems, personal computers, laptop computers, notebook computers, palm computers, personal digital assistants, portable electronic devices, battery powered devices, set-top boxes, encoders, decoders, transcoders, compressors, decompressors, pre-processors, post-processors, transmitters, receivers, transceivers, cipher circuits, cellular telephones, digital cameras, positioning and/or navigation systems, medical equipment, heads-up displays, wireless devices, audio recording, audio storage and/or audio playback devices, video recording, video storage and/or video playback devices, game platforms, peripherals and/or multi-chip modules. Those skilled in the relevant art(s) would understand that the elements of the invention may be implemented in other types of devices to meet the criteria of a particular application.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, will be understood by those skilled in the art that various changes in form and details may be made without departing from the scope of the invention.

The invention claimed is:

1. A method for capacitance coupling noise accommodation, comprising the steps of:
    determining a plurality of mean voltages among a plurality of memory cells of a memory in response to a plurality of writes to the memory cells and a plurality of reads from the memory cells by a control circuit, wherein the mean voltages are determined in each of a plurality of cases related to inter-cell interference;
    generating a plurality of parameters in response to the mean voltages, wherein the parameters comprise a plurality of middle state mean voltages and one or more couplings between a plurality of perturbed memory cells and a plurality of neighboring memory cells adjacent to the perturbed memory cells; and
    adjusting one or more threshold voltages used to read from the memory based on the middle state mean voltages to operate independently of knowledge of middle state distributions in the memory cells.

2. The method according to claim 1, wherein
    the memory is a flash memory configured to store at least two bits in each of the memory cells,
    one of the parameters represents a horizontal capacitance coupling between the perturbed memory cells and the neighboring memory cells, and
    another of the parameters is a vertical capacitance coupling between the perturbed memory cells and the neighboring memory cells.

3. The method according to claim 1, wherein the cases include
    a final voltage case,
    a no inter-cell interference case,
    a vertical capacitance coupling case, and
    a horizontal capacitance coupling case.

4. The method according to claim 1, wherein the middle state mean voltages comprise the mean voltage of the perturbed memory cells in an erased state.

5. The method according to claim 1, wherein the middle state mean voltages comprise the mean voltage of the perturbed memory cells after programming a lower page and before programming an upper page in the perturbed memory cells.

6. The method according to claim 1, wherein the mean voltages are determined by writing random data to the memory cells and reading the random data from the memory cells.

7. The method according to claim 1, wherein the parameters are determined by performing a least mean squares estimation on a matrix comprising the mean voltages.

8. The method according to claim 1, further comprising the step of:
    weighting the matrix to mitigate inaccurate measurements of the mean voltages.

9. The method according to claim 1, wherein the steps are implemented in a solid-state drive.

10. An apparatus comprising:
    an interface configured to process a plurality of read/write operations to/from a memory; and
    a control circuit configured to
        determine a plurality of mean voltages among a plurality of memory cells of the memory in response to a plurality of writes to the memory cells and a plurality of reads from the memory cells, wherein the mean voltages are determined in each of a plurality of cases related to inter-cell interference,
        generate a plurality of parameters in response to the mean voltages, wherein the parameters comprise a plurality of middle state mean voltages and one or more couplings between a plurality of perturbed memory cells and a plurality of neighboring memory cells adjacent to the perturbed memory cells, and
        adjust one or more threshold voltages used to read from the memory based on the middle state mean voltages to operate independently of knowledge of middle state distributions in the memory cells.

11. The apparatus according to claim 10, wherein
    the memory is a flash memory configured to store at least two bits in each of the memory cells,
    one of the parameters is a horizontal capacitance coupling between the perturbed memory cells and the neighboring memory cells, and
    another of the parameters is a vertical capacitance coupling between the perturbed memory cells and the neighboring memory cells.

12. The apparatus according to claim 10, wherein the cases include
    a final voltage case,
    a no inter-cell interference case,
    a vertical capacitance coupling case, and
    a horizontal capacitance coupling case.

13. The apparatus according to claim 10, wherein the middle state mean voltages comprise the mean voltage of the perturbed memory cells in an erased state.

14. The apparatus according to claim 10, wherein the middle state mean voltages comprise the mean voltage of the perturbed memory cells after programming a lower page and before programming an upper page in the perturbed memory cells.

15. The apparatus according to claim 10, wherein the mean voltages are determined by writing random data to the memory cells and reading the random data from the memory cells.

16. The apparatus according to claim 10, wherein the parameters are determined by performing a least mean squares estimation on a matrix comprising the mean voltages.

17. The apparatus according to claim 10, wherein the parameters are determined under one or more conditions of
    the memory is off-line and the parameters are estimated by the control circuit, and
    the memory is on-line and the parameters are updated a plurality of times by the control circuit.

18. The apparatus according to claim 10, wherein the interface and the control circuit are implemented as part of a solid-state drive.

19. An apparatus comprising:
a memory configured to store data; and
a controller configured to
determine a plurality of mean voltages among a plurality of memory cells of the memory in response to a plurality of writes to the memory cells and a plurality of reads from the memory cells, wherein the mean voltages are determined in each of a plurality of cases related to inter-cell interference,
generate a plurality of parameters in response to the mean voltages, wherein the parameters comprise a plurality of middle state mean voltages and one or more couplings between a plurality of perturbed memory cells and a plurality of neighboring memory cells adjacent to the perturbed memory cells, and
adjust one or more threshold voltages used to read from the memory based on the middle state mean voltages to operate independently of knowledge of middle state distributions in the memory cells.

20. The apparatus according to claim 19, wherein the memory and the controller are implemented as part of a solid-state drive.

* * * * *